United States Patent
Wu et al.

(10) Patent No.: US 11,747,684 B2
(45) Date of Patent: Sep. 5, 2023

(54) DISPLAY PANEL COMPRISING A CONDUCTIVE STRUCTURE LAYER HAVING A BENT PORTION ATTACHED TO A FIRST SMOOTH SURFACE OF A PROTECTIVE STRIP AND MANUFACTURING METHOD FOR THE DISPLAY PANEL

(71) Applicant: BOE Technology Group Co., Ltd., Beijing (CN)

(72) Inventors: Zhongbao Wu, Beijing (CN); Chuandong Liao, Beijing (CN); Ruoyu Ma, Beijing (CN); Haiwei Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 222 days.

(21) Appl. No.: 17/287,538

(22) PCT Filed: Aug. 31, 2020

(86) PCT No.: PCT/CN2020/112643
§ 371 (c)(1),
(2) Date: Apr. 22, 2021

(87) PCT Pub. No.: WO2021/057401
PCT Pub. Date: Apr. 1, 2021

(65) Prior Publication Data
US 2021/0382337 A1 Dec. 9, 2021

(30) Foreign Application Priority Data
Sep. 27, 2019 (CN) .......................... 201910923179.0

(51) Int. Cl.
*G02F 1/1345* (2006.01)

(52) U.S. Cl.
CPC .................................. *G02F 1/1345* (2013.01)

(58) Field of Classification Search
CPC ..................................................... H10K 59/129
See application file for complete search history.

(56) References Cited

U.S. PATENT DOCUMENTS

| 2006/0146263 A1* | 7/2006 | Park ..................... H05K 3/0052 |
| | | 349/149 |
| 2007/0222911 A1* | 9/2007 | Murase ............... G02F 1/13452 |
| | | 349/150 |

(Continued)

FOREIGN PATENT DOCUMENTS

| CN | 106558600 A | 4/2017 |
| CN | 107864552 A | 3/2018 |

(Continued)

OTHER PUBLICATIONS

Office Action dated Nov. 1, 2021 for Chinese Patent Application No. 2019109231790 and English Translation.

(Continued)

*Primary Examiner* — Paul C Lee
(74) *Attorney, Agent, or Firm* — Ling Wu; Stephen Yang; Ling and Yang Intellectual Property

(57) ABSTRACT

A display panel includes a first substrate on which a conductive structure layer is formed. The conductive structure layer has a bonding area close to a side edge thereof, at least a part of the bonding area of the conductive structure layer protrudes from a first side edge of the first substrate, and is bent toward a side of the first substrate away from the conductive structure layer and fixed; an end surface of the first side edge of the first substrate is provided with a first protective strip, the first protective strip has a first smooth surface facing the conductive structure layer and smoothly connected with a side surface of the first substrate on which (Continued)

the conductive structure layer is formed, and a bent part of the conductive structure layer is attached to the first smooth surface.

15 Claims, 13 Drawing Sheets

(56) References Cited

U.S. PATENT DOCUMENTS

| | | |
|---|---|---|
| 2016/0187686 A1 | 6/2016 | Lou et al. |
| 2016/0209582 A1 | 7/2016 | Kawata |
| 2018/0196300 A1 | 7/2018 | Jung et al. |
| 2019/0139905 A1 | 5/2019 | Cheng et al. |
| 2019/0189640 A1 | 6/2019 | Huang et al. |
| 2020/0050055 A1* | 2/2020 | Higano ............. G02F 1/134309 |
| 2020/0214137 A1 | 7/2020 | Huang et al. |
| 2020/0271977 A1 | 8/2020 | Chen et al. |
| 2021/0124202 A1 | 4/2021 | Pan |

FOREIGN PATENT DOCUMENTS

| | | | |
|---|---|---|---|
| CN | 107894681 A | | 4/2018 |
| CN | 108535907 A | | 9/2018 |
| CN | 108681123 A | | 10/2018 |
| CN | 108957812 A | | 12/2018 |
| CN | 108957878 A | | 12/2018 |
| CN | 109343249 A | | 2/2019 |
| CN | 109541834 A | * 3/2019 | ........... G02F 1/1333 |
| CN | 109541834 A | | 3/2019 |
| CN | 109671352 A | | 4/2019 |
| CN | 110596971 A | | 12/2019 |
| JP | 2001-223445 A | | 8/2001 |

OTHER PUBLICATIONS

International Search Report for PCT/CN2020/112643 dated Dec. 4, 2020.

Office Action dated Mar. 3, 2021 for Chinese Patent Application No. 201910923179.0 and English Translation.

* cited by examiner

DISPLAY PANEL COMPRISING A CONDUCTIVE STRUCTURE LAYER HAVING A BENT PORTION ATTACHED TO A FIRST SMOOTH SURFACE OF A PROTECTIVE STRIP AND MANUFACTURING METHOD FOR THE DISPLAY PANEL

CROSS-REFERENCE TO RELATED APPLICATIONS

The present application is a U.S. National Phase Entry of International Application No. PCT/CN2020/112643 having an international filing date of Aug. 31, 2020, which claims priority of Chinese Patent Application No. 201910923179.0 filed to the CNIPA on Sep. 27, 2019, entitled "Display panel, display device, and manufacturing method of the display panel". The entire contents of the above-identified applications are hereby incorporated by reference.

TECHNICAL FIELD

Embodiments of the present application relate to, but are not limited to, the technical field of display devices, in particular to a display panel, a display device, and a manufacturing method of the display panel.

BACKGROUND

Some display panels include an array substrate and a color filter substrate which are oppositely disposed. A bonding area electrically connected with an external circuit board is disposed at edge position of a side of the array substrate.

In some technologies, whether Chip On Film (COF) technology or Chip On Glass (COG) technology (that is, a chip is directly bonded on a glass substrate) is adopted, a frame on the external circuit board side of the display panel cannot be as narrow as other side frames. The reason is that edge alignment of the array substrate and the color filter substrate can be achieved on the sides other than the external circuit board side of the display panel, while on the external circuit board side of the display panel, because the array substrate is provided with bare metal wires (bonding area) which need to be electrically connected with the external circuit board, the edge alignment of the array substrate and the color filter substrate cannot be achieved. Therefore, when the other side frames of the display panel are extremely narrow, the frame on the external circuit board side of the display panel is still relatively wide.

SUMMARY

The following is a summary of subject matter described in detail herein. This summary is not intended to limit the protection scope of the claims.

An embodiment of the present application provides a display panel, which includes a first substrate, on which a conductive structure layer is formed, wherein the conductive structure layer has a bonding area close to a side edge thereof, at least a part of the bonding area of the conductive structure layer protrudes from a first side edge of the first substrate, and is bent toward a side of the first substrate away from the conductive structure layer and fixed; an end surface of the first side edge of the first substrate is provided with a first protective strip, the first protective strip has a first smooth surface facing the conductive structure layer and smoothly connected with a side surface of the first substrate on which the conductive structure layer is formed, and a bent part of the conductive structure layer is attached to the first smooth surface.

An embodiment of the present application also provides a display device, which includes the display panel above and a backplate assembly disposed on a side surface of the first substrate away from the conductive structure layer, wherein the conductive structure layer is bent along the first smooth surface and then attached to an end surface of the backplate assembly.

An embodiment of the present application also provides a manufacturing method of a display panel, including: forming a conductive structure layer on a first substrate, the conductive structure layer having a bonding area close to a side edge thereof; stripping at least a part of the bonding area from the first substrate; cutting off a part of the first substrate stripped from the bonding area so that a stripped part of the conductive structure layer protrudes from a cut end surface of the first substrate; disposing a first protective strip on the cut end surface of the first substrate, the first protective strip having a first smooth surface facing the conductive structure layer and smoothly connected with a side surface of the first substrate on which the conductive structure layer is formed; and bending and fixing the stripped part of the conductive structure layer along the first smooth surface.

Other aspects will become apparent upon reading and understanding accompanying drawings and the detailed description.

BRIEF DESCRIPTION OF DRAWINGS

The accompanying drawings are used to provide an understanding of embodiments of the present application, form a part of the specification, and explain technical solutions of the embodiments of the present application together with embodiments of the present application, and do not constitute a limitation on the technical solutions of embodiments of the present application.

Figure 1:
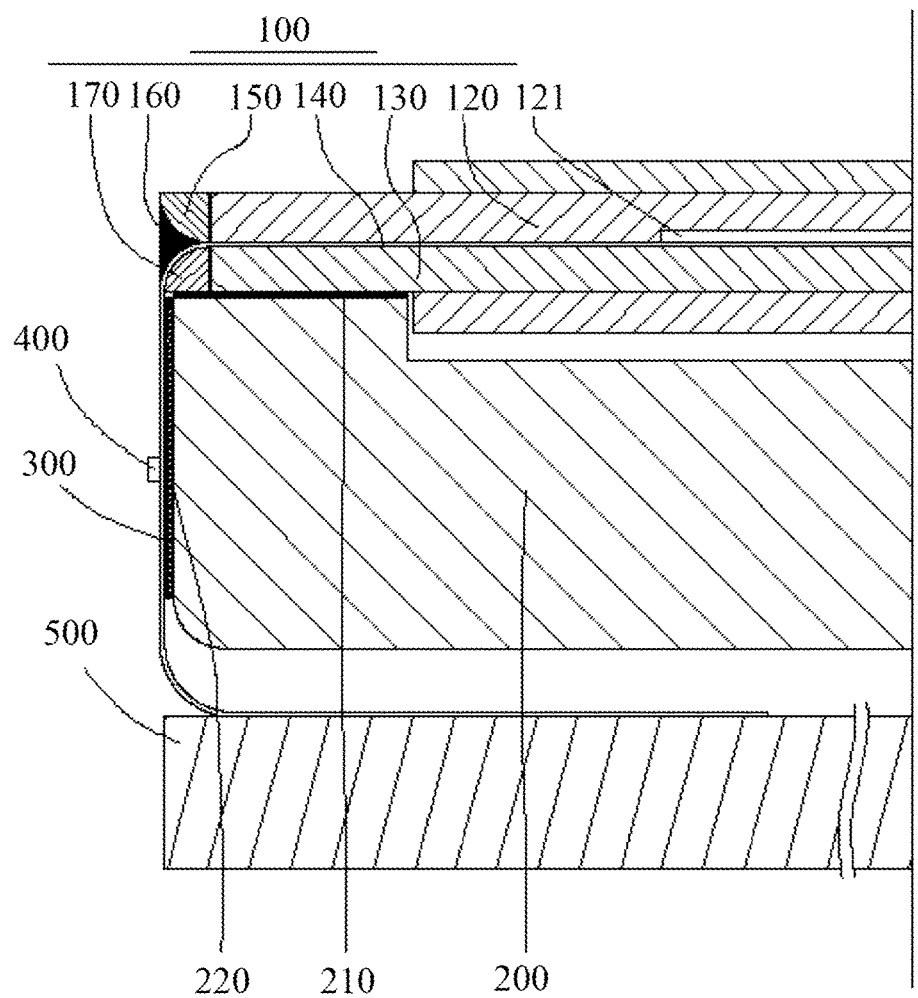
FIG. 1 is a schematic diagram of sectional structure of a display device according to some exemplary embodiments.

The reference numerals are:

100 display panel, 120 second substrate, 130 first substrate, 140 conductive structure layer, 150 second protective strip, 160 fixing adhesive, 170 first protective strip, 121 black matrix, 141 base layer, 142 conductive layer, 143 protective layer, 161 second fixing adhesive;

1201 upper surface of second substrate, 1202 end surface of second substrate, 131 stripped part of first substrate, 1301 lower surface of first substrate, 1302 cut end surface of first substrate, 1303 upper surface of stripped part of first substrate;

1501 first side surface, 1502 ¼ circular arc surface, 1503 second side surface, 1701 first side surface, 1702 ¼ circular arc surface, 1703 second side surface, 171 flange, 1711 top surface of flange, 1712 plane, 172 notch;

180 first protective strip, 1801 first side surface, 1802 ¼ elliptical arc surface, 181 flange, 1811 top surface of flange, 182 notch;

110 second protective strip, 1101 first side surface, 1102 ¼ elliptical arc surface, 1103 second side surface, 190 first protective strip, 1901 first side surface, 1902 ¼ elliptical arc surface, 190 second side, 191 flange, 1911 top surface of flange, 1912 plane, 192 notch;

200 backplate assembly, 210 double-sided tape, 220 end surface of backplate assembly, 300 insulating double-sided tape, 400 driving chip, 500 external circuit board;

600 first auxiliary fixture, 601 adsorption surface, 602 limiting surface;

700 second auxiliary fixture, 701 adsorption surface, 702 limiting surface;

800 second auxiliary fixture, 801 adsorption surface, 802 limiting surface, 803 avoidance groove.

DETAILED DESCRIPTION

Those of ordinary skill in the art should understand that modifications or equivalent substitutions may be made to technical solutions of embodiments of the present application without departing from the spirit and the scope of the technical solutions of embodiments of the present application, which shall be covered by the scope of the claims of the present application.

An embodiment of the present application provides a display panel. In some exemplary embodiments, as shown in FIG. 1, a display panel 100 includes a first substrate 130, a conductive structure layer 140 is formed on the first substrate 130, and the conductive structure layer 140 has a bonding area close to a side edge thereof. At least a part of the bonding area of the conductive structure layer 140 protrudes from a first side edge of the first substrate 130, and is bent toward a side of the first substrate 130 away from the conductive structure layer 140 and fixed. An end surface of the first side edge of the first substrate 130 is provided with a first protective strip 170, and the first protective strip 170 has a first smooth surface facing the conductive structure layer 140 and smoothly connected with a side surface of the first substrate 130 on which the conductive structure layer 140 is formed. A bent part of the conductive structure layer 140 is attached to the first smooth surface.

Referring to FIG. 1, in the display panel 100 of this embodiment of the present application, a conductive structure layer 140 is formed on a side surface of the first substrate 130 (an upper surface of the first substrate 130 in FIG. 1), and at least a part of the bonding area of the conductive structure layer 140 protrudes from the first side edge of the first substrate 130 and is bent toward another side surface of the first substrate 130 (i.e., a side surface of the lower surface of the first substrate 130). As such, the bonding area of the conductive structure layer 140 is located at the bent part of the conductive structure layer 140 and is not borne on the first substrate 130, which avoids that the first substrate 130 retains a wide frame area at its first side edge to bear the bonding area of the conductive structure layer 140, thus narrowing a frame area of the first substrate 130 and a frame of the display panel 100.

The end surface of the first side edge of the first substrate 130 is provided with a first protective strip 170, and the bent part of the conductive structure layer 140 is attached to the first smooth surface of the first protective strip 170, so that the bent part of the conductive structure layer 140 can be smoothly transitioned and protected.

Figure 2:
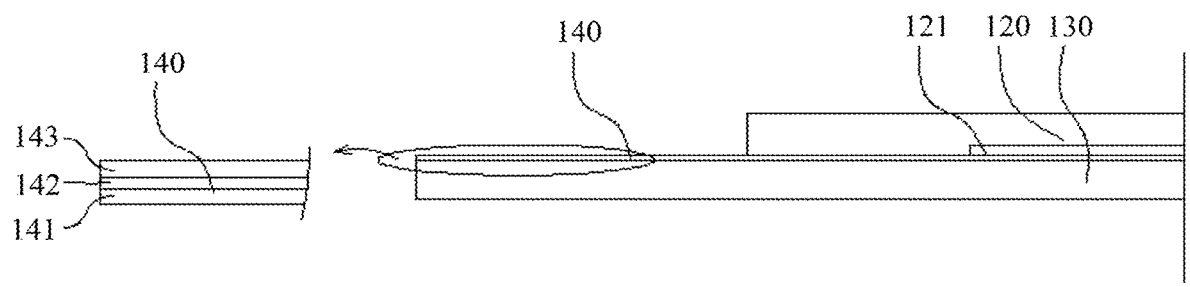
FIG. 2 is a schematic diagram of structure of a motherboard of a display panel and structure of a conductive structure layer on the motherboard in the manufacturing method of the display panel according to some exemplary embodiments.

In some exemplary embodiments, as shown in FIG. 2, the conductive structure layer 140 may include a base layer 141, a conductive layer 142, and a protective layer 143 which are sequentially stacked, and the materials of the base layer 141 and the protective layer 143 both include an organic material. The conductive layer 142 is a metal layer, which plays a conductive role and can be bent. The base layer 141 and the protective layer 143 adopt organic materials to ensure that the whole conductive structure layer 140 is flexible and can be bent. Materials of the base layer 141 and the protective layer 143 may be organic materials such as polyimide (PI) or polyethylene terephthalate (PET).

In some exemplary embodiments, as shown in FIG. 1, the display panel 100 may further include a second substrate 120 covering on the conductive structure layer 140, an end surface of the second substrate 120 corresponding to the end surface of the first side edge of the first substrate 130 is provided with a second protective strip 150, and a fixing adhesive 160 is filled between the second protective strip 150 and the bent part of the conductive structure layer 140. The second protective strip 150 may have a second smooth surface facing the conductive structure layer 140, and the fixing adhesive 160 is filled between the second smooth surface and the bent part of the conductive structure layer 140. The fixing adhesive 160 can be ultraviolet curing adhesive (UV adhesive), which can be cured by irradiation by an ultraviolet (UV) light after being filled, to fix the bent part of the conductive structure layer 140 on the first substrate 130 and the second substrate 120, and play a role in shaping and protecting.

In some exemplary embodiments, the display panel 100 may be a liquid crystal display panel or an Organic Light Emitting Diode (OLED) display panel. The first substrate 130 is an array substrate and the second substrate 120 is a color filter substrate, when the display panel 100 is a liquid crystal display panel.

In some exemplary embodiments, the first protective strip may include a strip-shaped body having a bottom surface, an attaching surface attached to the end surface of the first side edge of the first substrate 130, and the first smooth surface. The two ends of the first smooth surface are respectively connected with the attaching surface and the bottom surface. The first smooth surface includes an arc-shaped surface with an arc-shaped section, and the arc-shaped surface is smoothly connected with the side surface of the first substrate 130 on which the conductive structure layer 140 is formed. The first protective strip may further include a flange integrally connected with the strip-shaped body, the flange is connected to the attaching surface of the strip-shaped body, and the top surface of the flange is attached to the side surface of the first substrate 130 away from the conductive structure layer 140. The flange can also be provided with a plurality of notches at intervals along the length direction thereof, and the notches penetrate through a top surface and a bottom surface of the flange.

Figure 13A:
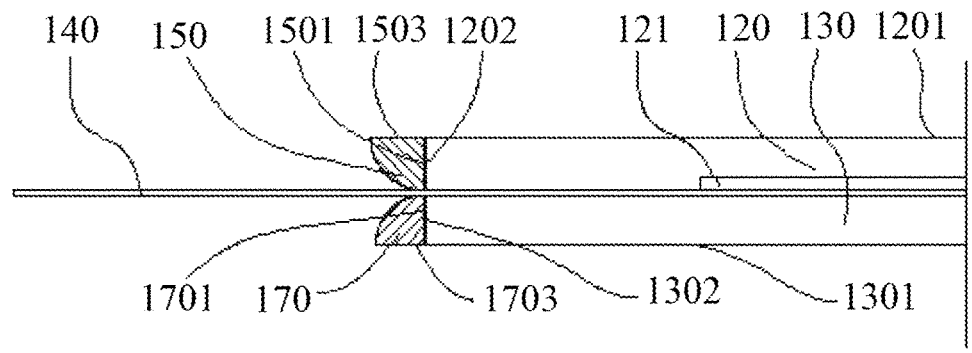
FIG. 13A is a schematic diagram of structure of a display panel in a manufacturing process according to some exemplary embodiments.
Figure 13B:
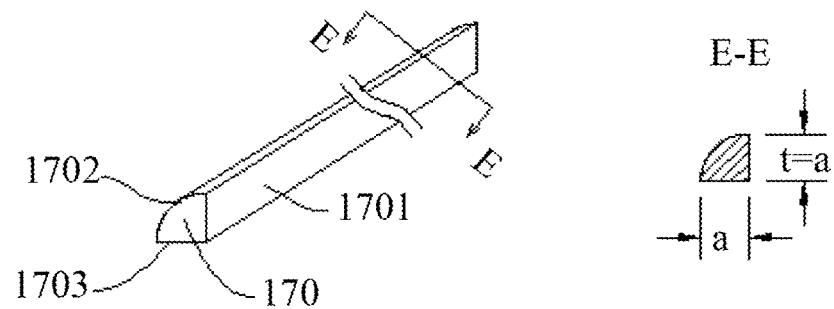
FIG. 13B is a schematic diagram of structure of a first protective strip in FIG. 13A.

In some exemplary embodiments, referring to FIG. 13B, FIG. 13B shows a perspective view of a first protective strip 170 and an E-E sectional view thereof. The shape of the first protective strip 170 in this embodiment is a ¼ cylinder, which is the strip-shaped body of the first protective strip 170 in this embodiment. The ¼ cylinder has a first side surface (that is, an attaching surface attached to the end surface of the first side edge of the first substrate 130) 1701, a second side surface (that is, a bottom surface of the first protective strip 170) 1703, and a ¼ circular arc surface 1702 connected between the first side surface 1701 and the second side surface 1703. The ¼ circular arc surface 1702 is the first smooth surface of the first protective strip 170 in this embodiment. Referring to FIG. 13A, which is a schematic diagram of structure of a display panel in a manufacturing process according to some exemplary embodiments, FIG. 13A shows the disposition of the first protective strip 170 in this embodiment, wherein the first side surface 1701 of the ¼ cylinder can be attached to the end surface 1302 of the first side edge of the first substrate 130, and adhesive can be used between the two surfaces for fixing. The ¼ circular arc surface 1702 is in smooth connection with the side surface of the first substrate 130 on which the conductive structure layer 140 is formed. The second side surface 1703 of the ¼ cylinder may be flush with the side surface of the first substrate 130 away from the conductive structure layer 140. Referring to the E-E sectional view of the first protective strip 170 in FIG. 13B, a radius of the ¼ circular arc surface 1702 of the first protective strip 170 is a, and the value of a is equal to the thickness t of the first substrate 130.

Figure 14A:
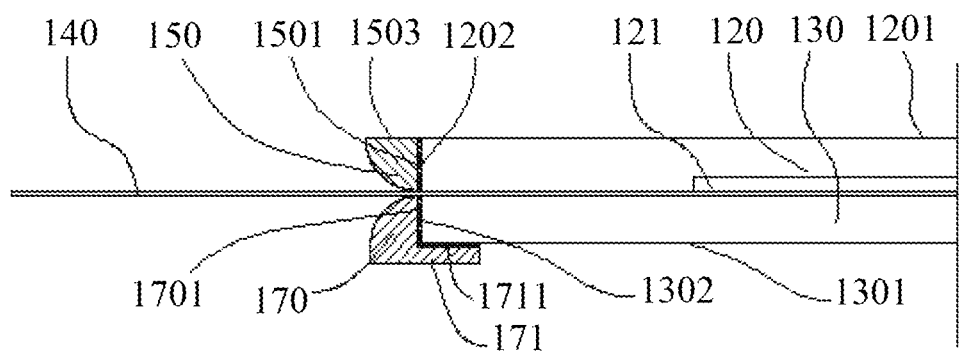
FIG. 14A is a schematic diagram of structure of a display panel in a manufacturing process according to some other exemplary embodiments.
Figure 14B:
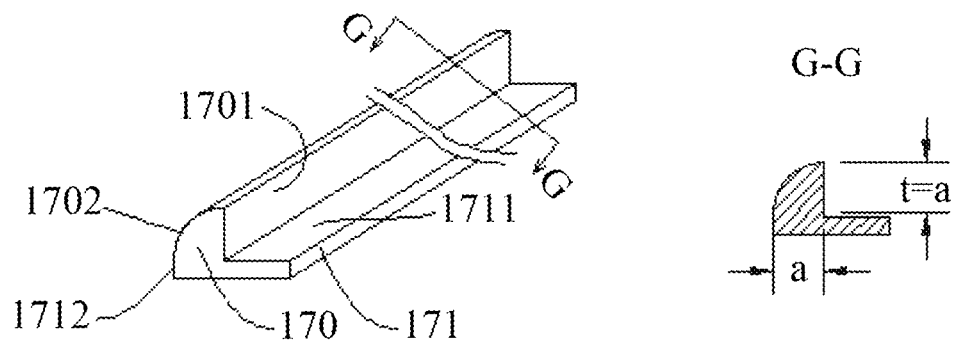
FIG. 14B is a schematic diagram of structure of a first protective strip in FIG. 14A.

In some exemplary embodiments, referring to FIG. 14B, FIG. 14B shows a perspective view of another first protective strip 170 and a G-G sectional view thereof. The first protective strip 170 of this embodiment includes a ¼ cylinder of FIG. 13B and a plate body with a rectangular section integrally connected with the ¼ cylinder. A top surface of the plate body is integrally connected to the second side surface 1703 of the ¼ cylinder and protrudes from the first side surface 1701, and a part of the plate body protruding from the first side surface 1701 of the ¼ cylinder forms a flange 171. In this embodiment, a part of the first protective strip 170 excluding the flange 171 can be referred to as a strip-shaped body. Referring to FIG. 14A, which is a schematic diagram of structure of a display panel in a manufacturing process according to some other exemplary embodiments, FIG. 14A shows the disposition of the first protective strip 170 according to this embodiment. Herein, the first side surface 1701 of the ¼ cylinder is attached to the end surface 1302 of the first side edge of the first substrate 130, and adhesive is used between the two surfaces for fixing. The ¼ circular arc surface 1702 is in smooth connection with the side surface of the first substrate 130 on which the conductive structure layer 140 is formed. The top surface 1711 of the flange 171 is attached to the side surface of the first substrate 130 away from the conductive structure layer 140, and adhesive is used between the two surfaces for fixing, so that the flange 171 can play a role in positioning. A vertical plane 1712 on a side of the plate body is connected with and tangent to the ¼ circular arc surface 1702 of the ¼ cylinder. In this embodiment, a radius of the ¼ cylinder is a, and the value of a is equal to the thickness t of the first substrate 130. The first smooth surface of the first protective strip 170 of this embodiment includes the ¼ circular arc surface 1702 and the vertical plane 1712.

Figure 14C:
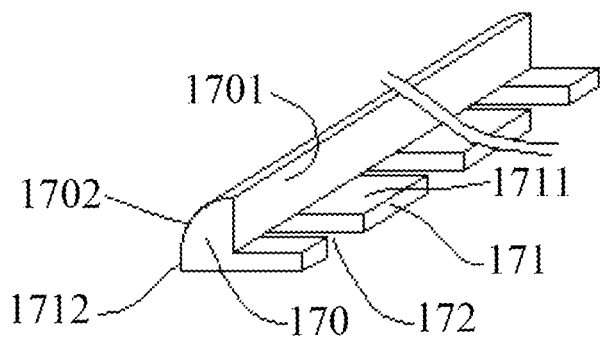
FIG. 14C is a schematic diagram of another structure of a first protective strip in FIG. 14A.
Figure 14D:
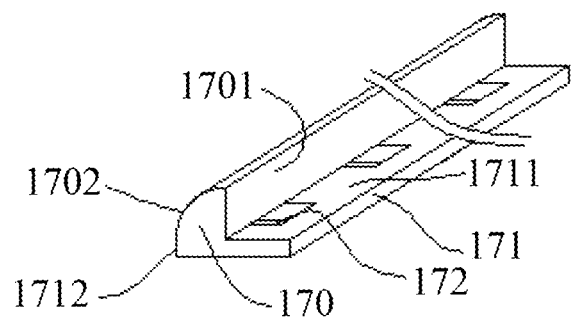
FIG. 14D is a schematic diagram of still another structure of a first protective strip in FIG. 14A.

In some exemplary embodiments, referring to FIG. 14C and FIG. 14D, the flange 171 of the first protective strip 170 in FIG. 14B may also be provided with a plurality of notches 172 which are disposed at intervals along the length direction of the flange 171 and penetrate through the top surface and bottom surface of the flange 171. The notches 172 may extend from the first side surface 1701 of the ¼ cylinder along the width direction of the flange 171, and may extend to the other side edge of the flange 171 to form open notches 172 with one end open (see FIG. 14C), or may not extend to the other side edge of the flange 171 to form closed notches 172 (see FIG. 14D). The notches 172 can be clamped on corresponding clamping blocks on a backplate assembly when the display panel 100 is assembled with the backplate assembly (for example a backlight assembly), so that the relative positions of them can be limited. Open notches 172 can limit the movement of the backplate assembly in the width direction of the display panel 100, and closed notches 172 can limit the movement of the backplate assembly in the length and width directions of the display panel 100.

Figure 15A:
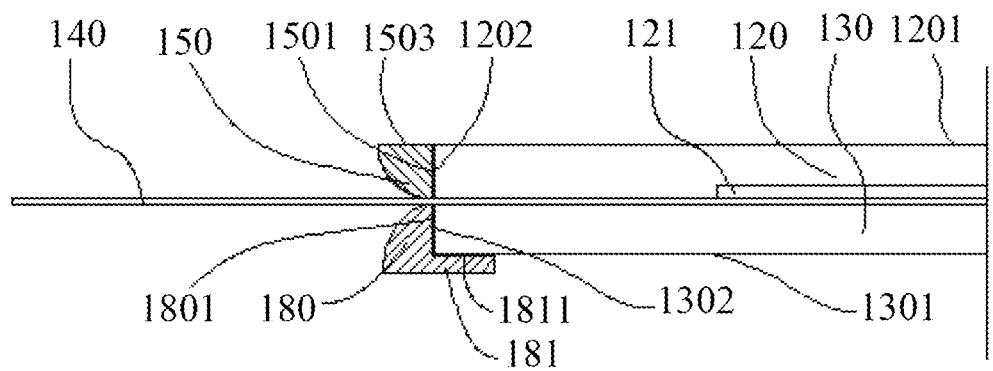
FIG. 15A is a schematic diagram of structure of a display panel in a manufacturing process according to some other exemplary embodiments.
Figure 15B:
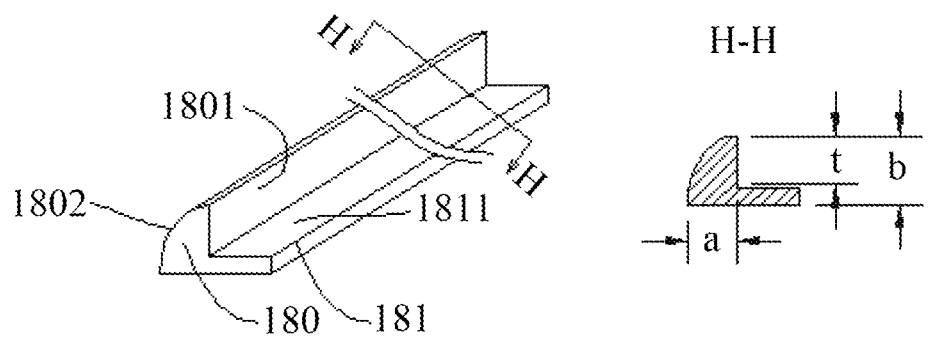
FIG. 15B is a schematic diagram of structure of a first protective strip in FIG. 15A.

In some exemplary embodiments, referring to FIG. 15B, FIG. 15B shows a perspective view of another first protective strip 180 and an H-H sectional view thereof. The first protective strip 180 of this embodiment includes a strip-shaped body having a ¼ elliptical cylinder shape and a flange 181 with a rectangular section integrally connected with the strip-shaped body. The strip-shaped body has a first side surface 1801, a second side surface (that is, the bottom surface of the strip-shaped body) and a ¼ elliptical arc surface 1802 connected between the first side surface 1801 and the second side surface. A side surface of the flange 181 is integrally connected with the first side surface 1801 of the strip-shaped body, and the bottom surface of the flange 181 is flush with the second side surface of the strip-shaped body. Referring to FIG. 15A, which is a schematic diagram of structure of a display panel in a manufacturing process according to some other exemplary embodiments, FIG. 15A shows the disposition of the first protective strip 180 according to this embodiment. Herein, the first side surface 1801 of the strip-shaped body can be attached to the end surface 1302 of the first side edge of the first substrate 130, and adhesive can be used between the two surfaces for fixing. The ¼ elliptical arc surface 1802 is smoothly connected with the side surface of the first substrate 130 on which the conductive structure layer 140 is formed. The top surface 1811 of the flange 181 is attached to the side surface of the first substrate 130 away from the conductive structure layer 140, and adhesive is used between the two surfaces for fixing, so that the flange 181 can play a role in positioning. Referring to the H-H sectional view of the first protective strip 180 in FIG. 15B, the long semi-axis of the strip body of ¼ elliptical cylinder shape is b, and the short semi-axis of it is a, and the value of b is equal to the thickness t of the first substrate 130 plus the thickness of the flange 181. The ¼ elliptical arc surface 1802 of the strip body is the first smooth surface of the first protective strip 180 in this embodiment.

Figure 15C:
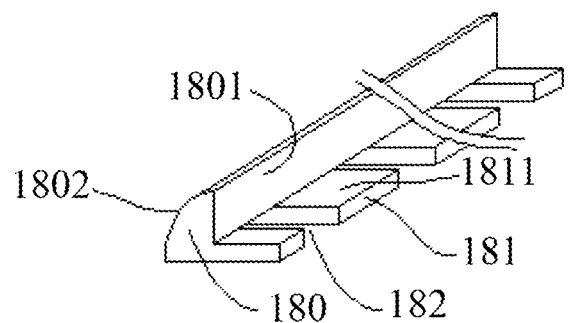
FIG. 15C is a schematic diagram of another structure of a first protective strip in FIG. 15A.
Figure 15D:
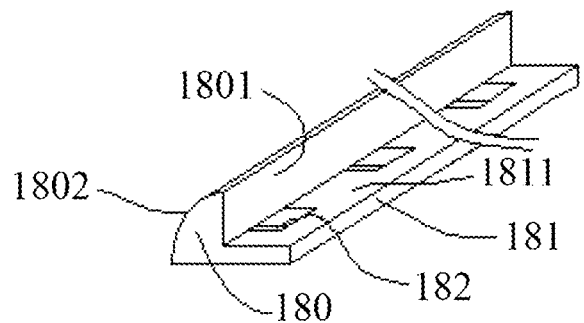
FIG. 15D is a schematic diagram of still another structure of a first protective strip in FIG. 15A.

In some exemplary embodiments, referring to FIG. 15C and FIG. 15D, the flange 181 of the first protective strip 180 of FIG. 15B may be provided with a plurality of notches 182 which are arranged at intervals along the length direction of the flange 181, and the notches 182 penetrate through the top surface and the bottom surface of the flange 181. The notches 182 may extend from the first side surface 1801 of the strip-shaped body along the width direction of the flange 181, and may extend to the other side edge of the flange 181 to form open notches 182 (see FIG. 15C), or may not extend to the other side edge of the flange 181 to form closed notches 182 (see FIG. 15D).

Figure 16A:
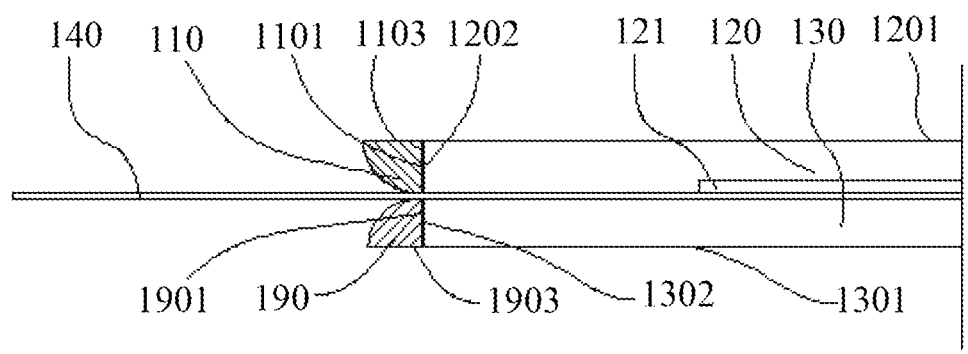
FIG. 16A is a schematic diagram of structure of a display panel in a manufacturing process according to some other exemplary embodiments.
Figure 16B:
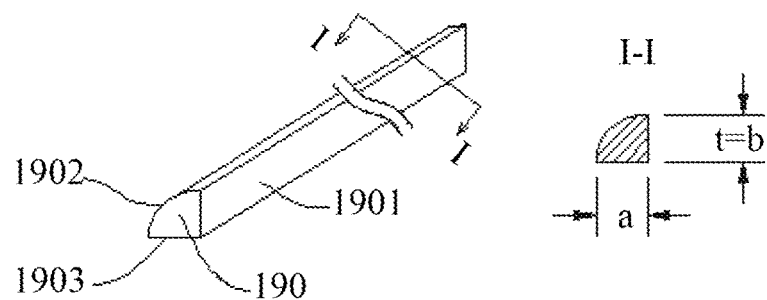
FIG. 16B is a schematic diagram of structure of a first protective strip in FIG. 16A.

In some exemplary embodiments, referring to FIG. 16B, FIG. 16B shows a perspective view of another first protective strip 190 and an I-I sectional view thereof. The shape of the first protective strip 190 in this embodiment is a ¼ elliptical cylinder, which is the strip body of the first protective strip 190 in this embodiment. The ¼ elliptical cylinder has a first side surface (that is, the attaching surface attached to the end surface of the first side edge of the first substrate 130) 1901, a second side surface (that is, the bottom surface of the first protective strip 190) 1903, and a ¼ elliptical arc surface 1902 connected between the first side surface 1901 and the second side surface 1903. The ¼ elliptical arc surface 1902 is the first smooth surface of the first protective strip 190 in this embodiment. Referring to FIG. 16A, which is a schematic diagram of structure of a display panel in a manufacturing process according to some other exemplary embodiments, FIG. 16A shows the disposition of the first protective strip 190 in this embodiment. Herein, the first side surface 1901 can be attached to the end surface 1302 of the first side edge of the first substrate 130, and adhesive can be used between the two surfaces for fixing. The ¼ elliptical arc surface 1902 is smoothly connected with the side surface of the first substrate 130 on which the conductive structure layer 140 is formed. The second side surface 1903 may be flush with the side surface of the first substrate 130 away from the conductive structure layer 140. Referring to the I-I sectional view of the first protective strip in FIG. 16B, the long semi-axis of the ¼ elliptical cylinder is a and the short semi-axis of it is b, and the value of b is equal to the thickness t of the first substrate 130.

Figure 17A:
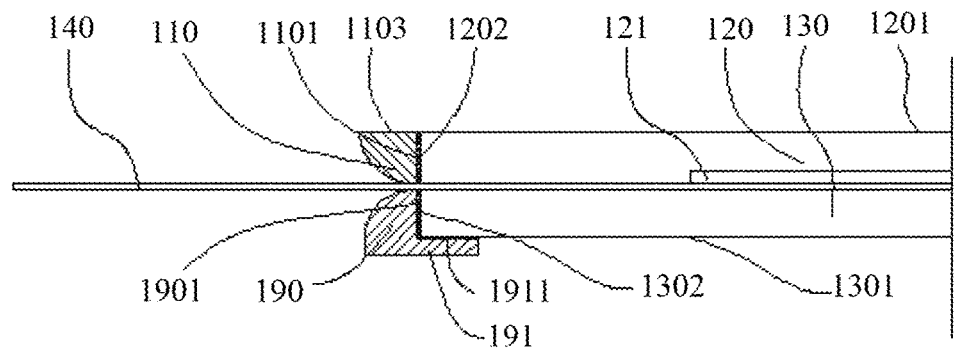
FIG. 17A is a schematic diagram of structure of a display panel in a manufacturing process according to some other exemplary embodiments.
Figure 17B:
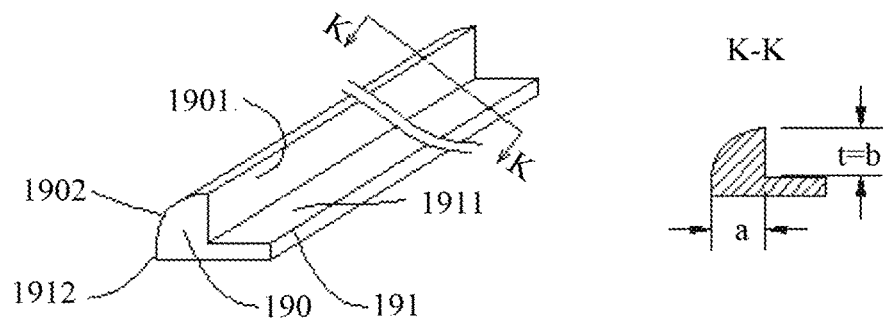
FIG. 17B is a schematic diagram of structure of a first protective strip in FIG. 17A.

In some exemplary embodiments, referring to FIG. 17B, FIG. 17B shows a perspective view of another first protective strip 190 and a K-K sectional view thereof. The first protective strip 190 of this embodiment includes the ¼ elliptical cylinder of FIG. 16B and a plate body with a rectangular section integrally connected with the ¼ elliptical cylinder. The top surface of the plate body is integrally connected with the second side surface 1903 of the ¼ elliptical cylinder and protrudes from the first side surface 1901 of the ¼ elliptical cylinder, and the part of the plate body protruding from the first side surface 1901 of the ¼ elliptical cylinder forms a flange 191. In this embodiment, a part of the first protective strip 190 excluding the flange 191 can be referred to as a strip-shaped body. Referring to FIG. 17A, which is a schematic diagram of structure of a display panel in a manufacturing process according to some other exemplary embodiments, FIG. 17A shows the disposition of the first protective strip 190 in this embodiment. Herein, the first side surface 1901 is attached to the end surface 1302 of the first side edge of the first substrate 130, and adhesive is used between the two surfaces for fixing. The ¼ elliptical arc surface 1902 is smoothly connected with the side surface of the first substrate 130 on which the conductive structure layer 140 is formed. The top surface 1911 of the flange 191 is attached to the side surface of the first substrate 130 away from the conductive structure layer 140, and adhesive is used between the two surfaces for fixing, so that the flange 191 can play a role in positioning. Referring to the K-K sectional view of the first protective strip in FIG. 17B, the long semi-axis of the ¼ elliptical cylinder is a, and the short semi-axis of it is b, and the value of b is equal to the thickness t of the first substrate 130. The vertical plane 1912 on a side of the plate body is connected with and tangent to the ¼ elliptical arc surface 1902 of the ¼ elliptical cylinder. The first smooth surface of the first protective strip 190 of this embodiment includes the ¼ elliptical arc surface 1902 and the vertical plane 1912.

Figure 17C:
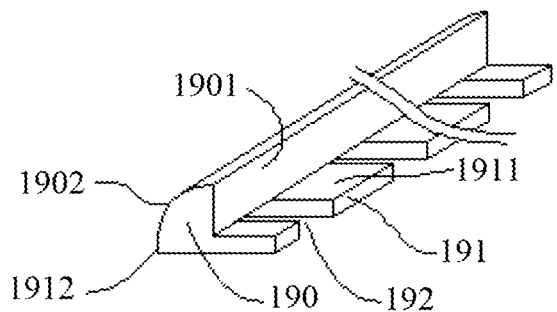
FIG. 17C is a schematic diagram of another structure of a first protective strip in FIG. 17A.
Figure 17D:
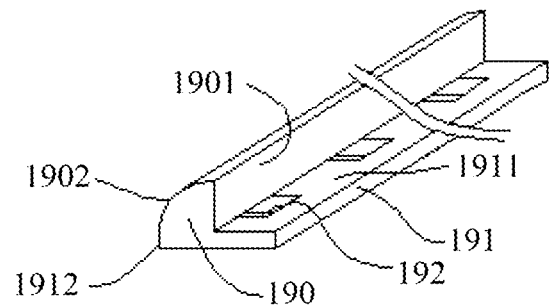
FIG. 17D is a schematic diagram of still another structure of a first protective strip in FIG. 17A.
Figure 18:
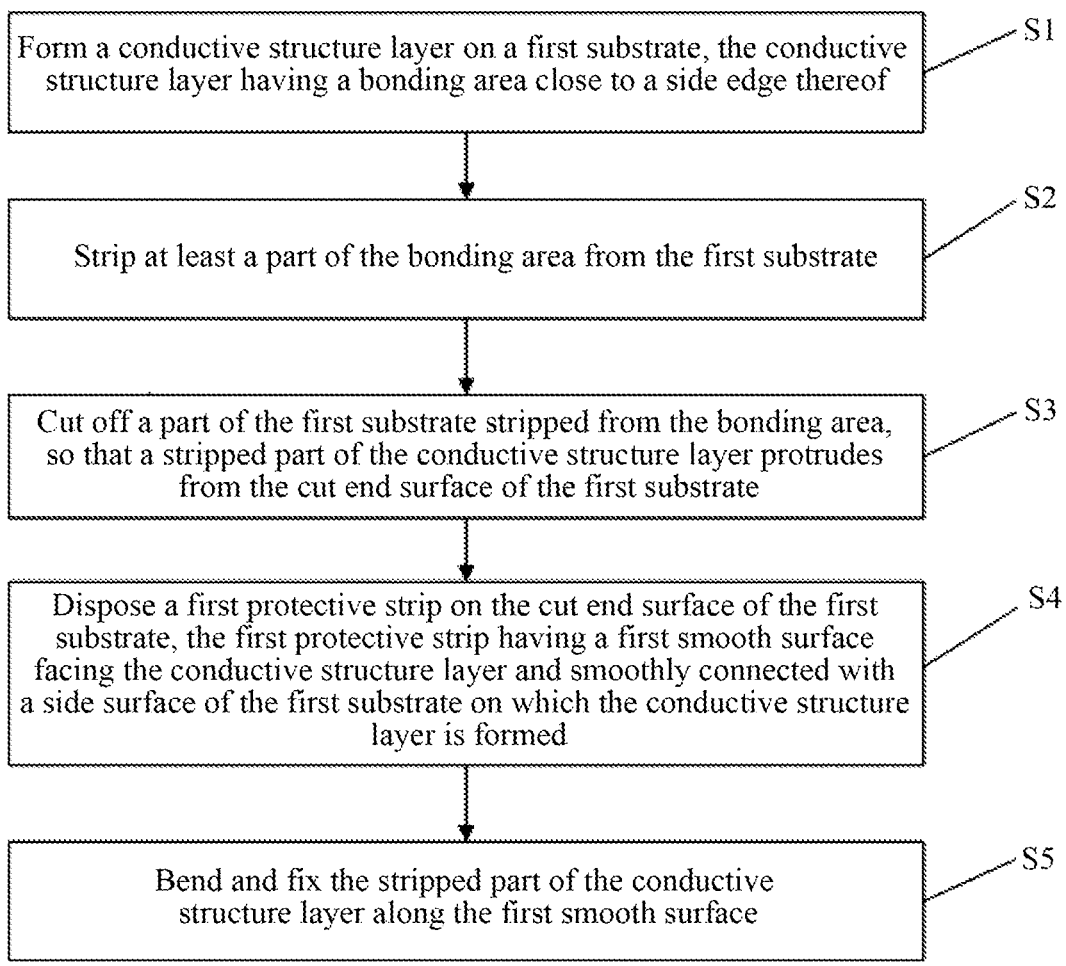
FIG. 18 is a flow chart of a manufacturing method of a display panel according to some exemplary embodiments.
Figure 19:
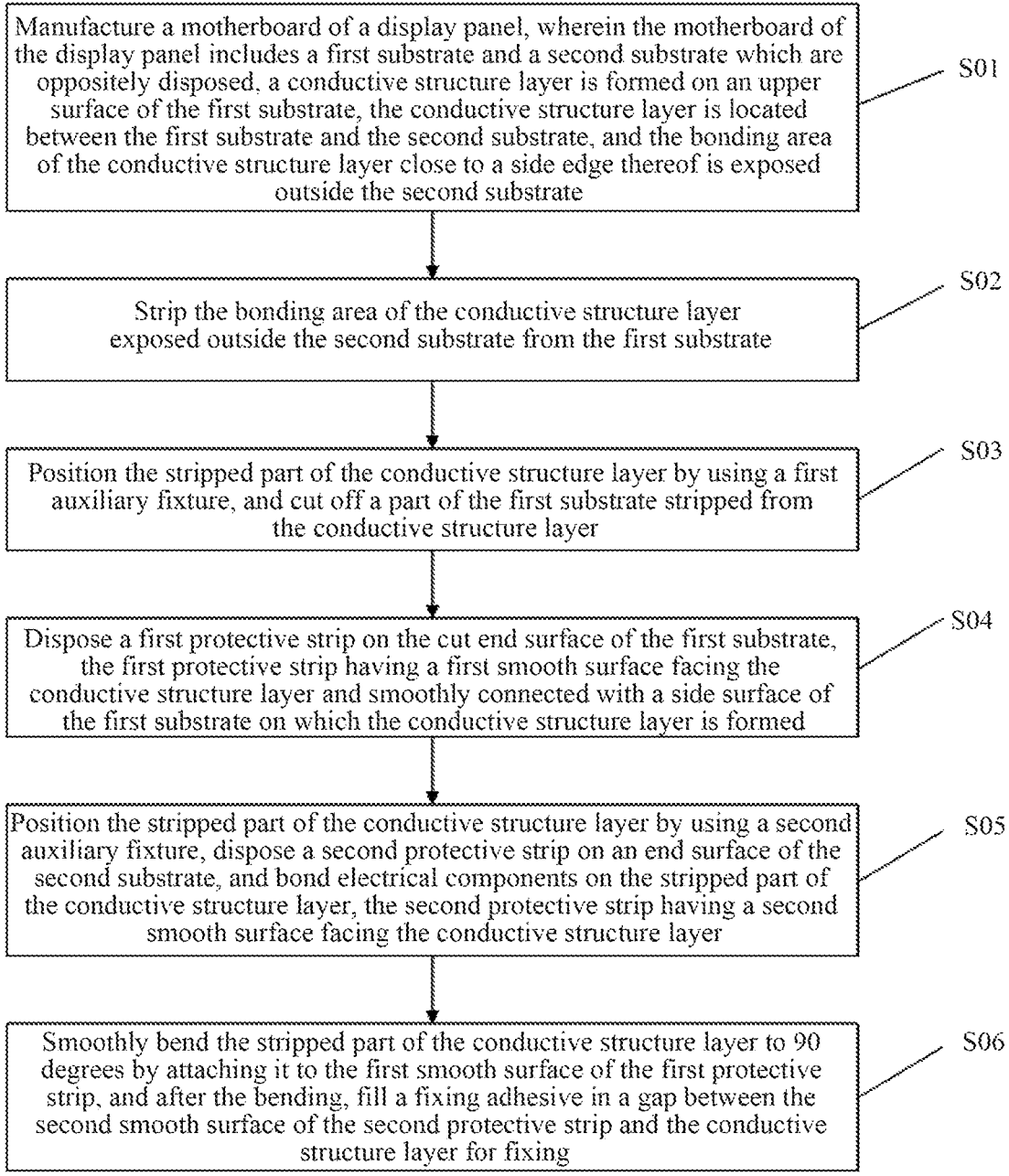
FIG. 19 is a flow chart of a manufacturing method of a display panel according to some other exemplary embodiments.

In some exemplary embodiments, referring to FIG. 17C and FIG. 17D, the flange 191 of the first protective strip 190 of FIG. 17B may be provided with a plurality of notches 192 which are disposed at intervals along the length direction of the flange 191, and the notches 192 penetrate through the top surface and bottom surface of the flange 191. The notches 192 may extend from the first side surface 1901 of the ¼ elliptical cylinder along the width direction of the flange 191, and may extend to the other side edge of the flange 191 to form open notches 192 with one end open (see FIG. 17C), or may not extend to the other side edge of the flange 191 to form closed notches 192 (see FIG. 17D).

In some exemplary embodiments, the second protective strip includes a strip-shaped body having a top surface, an attaching surface attached to the end surface of the second substrate 120, and a second smooth surface. The two ends of the second smooth surface are respectively connected with the attaching surface and the top surface, and the second smooth surface includes an arc-shaped surface with an arc-shaped section, and the arc-shaped surface is smoothly connected with the side surface of the second substrate 120 facing the conductive structure layer 140.

Figure 13C:
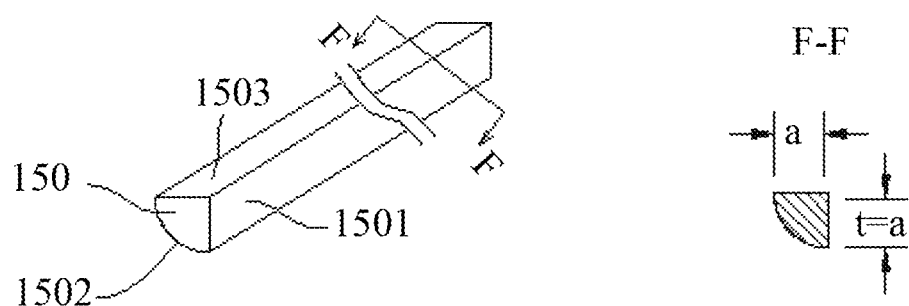
FIG. 13C is a schematic diagram of structure of a second protective strip in FIG. 13A.

In some exemplary embodiments, referring to FIG. 13C, FIG. 13C shows a perspective view of the second protective strip 150 and a F-F sectional view thereof. The second protective strip 150 of this embodiment may include a strip-shaped body, and the shape of the strip-shaped body is a ¼ cylinder. The strip-shaped body has a first side surface (that is, the attaching surface attached to the end surface of the second substrate 120) 1501, a second side surface (that is, the top surface of the strip-shaped body) 1503, and a ¼ circular arc surface 1502 connected between the first side surface 1501 and the second side surface 1503. The ¼ circular arc surface 1502 is the second smooth surface of the second protective strip 150 in this embodiment. Referring to FIG. 13A, which is a schematic diagram of structure of a display panel in a manufacturing process of some exemplary embodiments, FIG. 13A shows the disposition of the second protective strip 150 in this embodiment (the structure and disposition of the second protective strip in FIG. 14A and FIG. 15A are the same as FIG. 13A). Herein, the first side surface 1501 can be attached to the end surface 1202 of the second substrate 120, and adhesive can be used between the two surfaces for fixing. The ¼ circular arc surface 1502 is smoothly connected with the side surface of the second substrate 120 facing the conductive structure layer 140. The second side surface 1503 may be flush with the upper surface 1201 of the second substrate 120. Referring to the F-F sectional view of the second protective strip 150 in FIG. 13C, a radius of the ¼ circular arc surface 1502 of the strip body is a, and the value of a is equal to the thickness t of the second substrate 120.

Figure 16C:
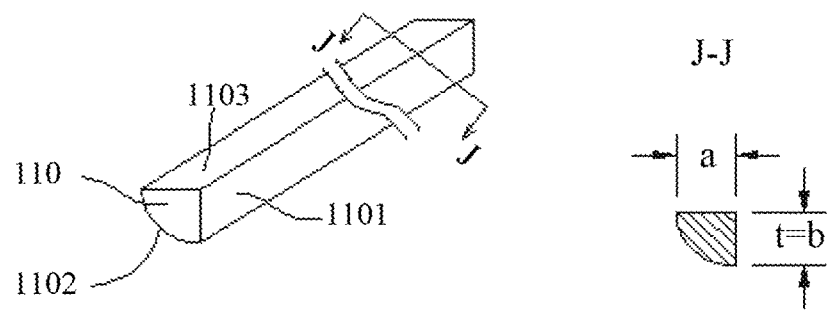
FIG. 16C is a schematic diagram of structure of a second protective strip in FIG. 16A.

In some exemplary embodiments, referring to FIG. 16C, FIG. 16C shows a perspective view of another second protective strip 110 and a J-J sectional view thereof. The second protective strip 110 of this embodiment may include a strip-shaped body, and the shape of the strip-shaped body is a ¼ elliptical cylinder. The strip-shaped body has a first side surface (that is, the attaching surface attached to the end surface of the second substrate 120) 1101, a second side surface (that is, the top surface of the strip-shaped body) 1103, and a ¼ elliptical arc surface 1102 connected between the first side surface 1101 and the second side surface 1103. The ¼ elliptical arc surface 1102 is the second smooth surface of the second protective strip 110 in this embodiment. Referring to FIG. 16A, which is a schematic diagram of structure of a display panel in a manufacturing process according to some other exemplary embodiments, FIG. 16A shows the disposition of the second protective strip 110 in this embodiment (the structure and disposition of the second protective strip in FIG. 17A are the same as FIG. 16A). The first side surface 1101 can be attached to the end surface 1202 of the second substrate 120, and adhesive can be used between the two surfaces for fixing. The ¼ elliptical arc surface 1102 is smoothly connected with a side surface of the second substrate 120 facing the conductive structure layer 140. The second side surface 1103 may be flush with the upper surface 1201 of the second substrate 120. Referring to the J-J sectional view of the second protective strip 110 in FIG. 16C, the section of the strip body is a ¼ elliptical plane, and the long semi-axis of the ¼ elliptical plane is a, and the short semi-axis of it is b, and the value of b is equal to the thickness t of the second substrate 120.

An embodiment of the present application also provides a display device, as shown in FIG. 1, which includes the display panel 100 described in any embodiment and a backplate assembly 200 disposed on the side surface of the first substrate 130 away from the conductive structure layer 140, and the conductive structure layer 140 is bent along the first smooth surface of the first protective strip and attached to the end surface 220 of the backplate assembly. That is, at least a part of the bonding area of the conductive structure layer 140 is fixed on the end surface 220 of the backplate assembly 200.

In some exemplary embodiments, the display device of the embodiment of this application may be a liquid crystal display device or an Organic Light Emitting Diode (OLED) display device. As for the former, the display panel 100 is a liquid crystal display panel, and the backplate assembly 200 is a backlight assembly. As for the latter, the display panel 100 is an OLED display panel, and the backplate assembly 200 is a back cover plate. The back side of the first substrate 130 of the display panel 100 (that is, the side surface of the first substrate 130 away from the conductive structure layer 140) may be fixed on the backplate assembly 200 by a double-sided tape 210.

In some exemplary embodiments, as shown in FIG. 1, a side of the conductive structure layer 140 where the bonding area of is located is bent 90 degrees toward the back side of the first substrate 130, and a part of the bonding area of the conductive structure layer 140 corresponding to the end surface 220 of the backplate assembly can be fixed on the end surface 220 of the backplate assembly 200 by an insulating double-sided tape 300. The side of the conductive structure layer 140 where the bonding area is located can be bent to the back side of the backplate assembly 200.

In some exemplary embodiments, as shown in FIG. 1, the display device further includes a driving chip 400 and an external circuit board 500 electrically connected with the bonding area of the conductive structure layer 140. The driving chip 400 is attached to a part of the bonding area of the conductive structure layer 140 corresponding to the end surface 220 of the backplate assembly, and the external circuit board 500 can be a flexible circuit board, which can be attached to a part of the bonding area of the conductive structure layer 140 corresponding to the back side of the backplate assembly 200.

In some exemplary embodiments, as shown in FIG. 1, the display panel 100 further includes a first polarizer disposed on a side surface of the first substrate 130 away from the second substrate 120 and a second polarizer disposed on a side surface of the second substrate 120 away from the first substrate 130. A black matrix 121 is disposed on the side surface of the second substrate 120 facing the first substrate 130.

Figure 20:
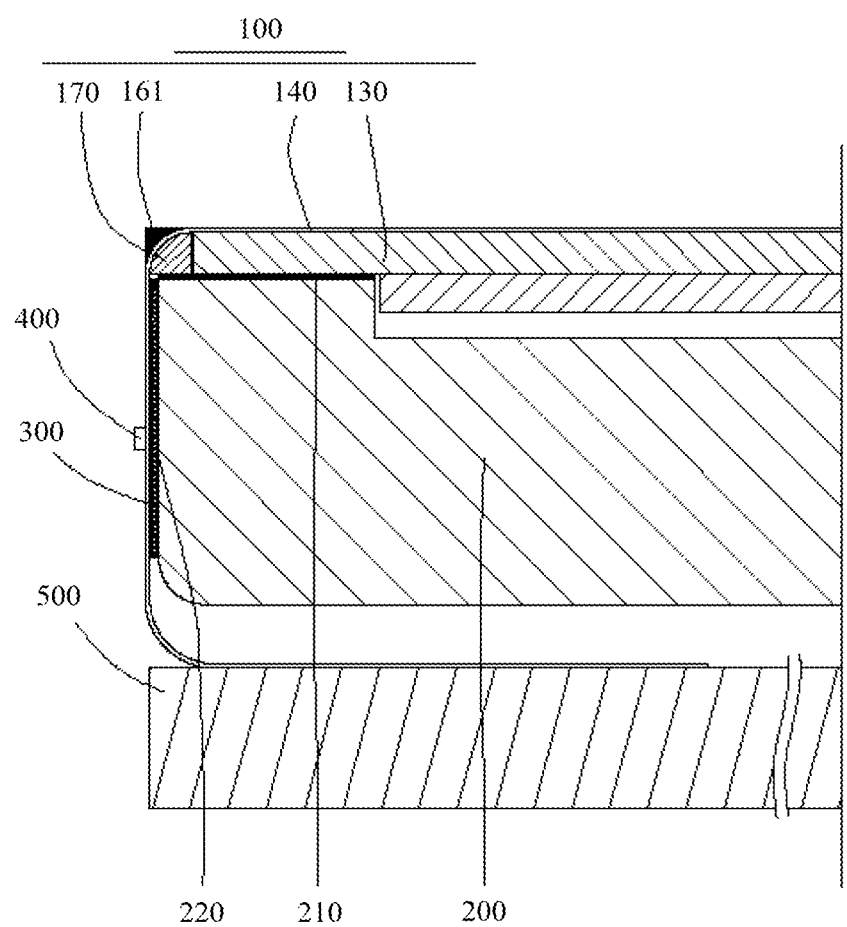
FIG. 20 is a schematic diagram of sectional structure of a display device according to some other exemplary embodiments.

Referring to FIG. 20, FIG. 20 is a schematic diagram of sectional structure of a display device according to some other exemplary embodiments. FIG. 20 shows a display panel 100 according to some other exemplary embodiments. This embodiment differs from the embodiment of the display panel shown in FIG. 1 in that the display panel 100 of this embodiment does not include a second substrate, and a first fixing adhesive (not shown in the figure) is daubed between a lower surface of a bent part of a conductive structure layer 140 and a first smooth surface of a first protective strip 170, to fix the bent part of the conductive structure layer 140 on the first smooth surface of the first protective strip 170. In addition, an upper surface of the bent part of the conductive structure layer 140 may be coated with a second fixing adhesive 161, and the second fixing adhesive 161 together with the first protective strip 170 form a right-angle end surface of the first substrate 130 after the second fixing adhesive 161 is cured. Other structures of this embodiment may be the same as the embodiment of the display panel or display device shown in FIG. 1.

Referring to FIG. 1 to FIG. 19, an embodiment of the present application also provides a manufacturing method of a display panel, which includes:

S1: forming a conductive structure layer 140 on a first substrate 130, the conductive structure layer 140 having a bonding area close to a side edge thereof;

S2: stripping at least a part of the bonding area from the first substrate 130;

S3: cutting off a part of the first substrate 130 stripped from the bonding area, so that a stripped part of the conductive structure layer 140 protrudes from the cut end surface 1302 of the first substrate 130;

S4: disposing a first protective strip 170 on the cut end surface 1302 of the first substrate 130, and the first protective strip 170 has a first smooth surface facing the conductive structure layer 140 and smoothly connected with a side surface of the first substrate 130 on which the conductive structure layer 140 is formed; and S5: bending and fixing the stripped part of the conductive structure layer 140 along the first smooth surface.

Figure 3:
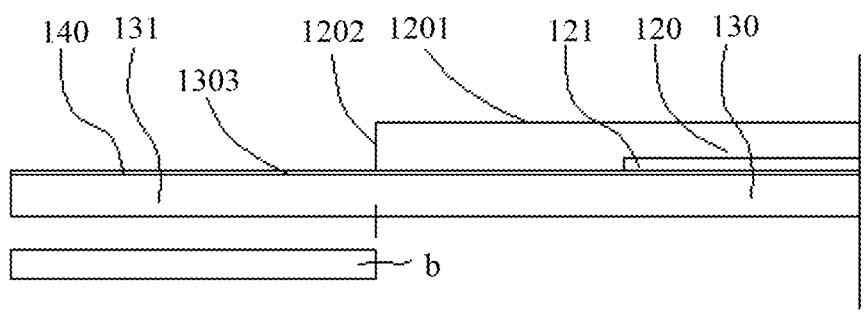
FIG. 3 is a schematic diagram of a process of stripping a bonding area of a conductive structure layer of a motherboard of a display panel in FIG. 2 from a first substrate according to some exemplary embodiments.

In some exemplary embodiments, referring to FIG. 3, step S2 includes: irradiating the bonding area of the conductive structure layer 140 by laser b from a side of the first substrate 130 away from the conductive structure layer 140, so that a corresponding part of the bonding area is stripped from the first substrate 130.

Figure 4:
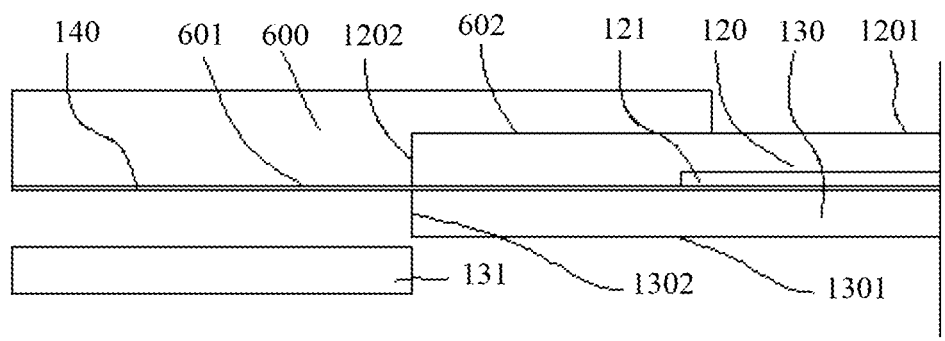
FIG. 4 is a schematic diagram of a process of cutting off a part of a first substrate stripped from a bonding area of a conductive structure layer in FIG. 3 according to some exemplary embodiments.

In some exemplary embodiments, referring to FIG. 4, in step S3, the cutting off a part of the first substrate 130 stripped from the bonding area includes: positioning the stripped part of the conductive structure layer 140 with a first auxiliary fixture 600, and then cutting off the part of the first substrate 130 stripped from the bonding area.

Figure 8:
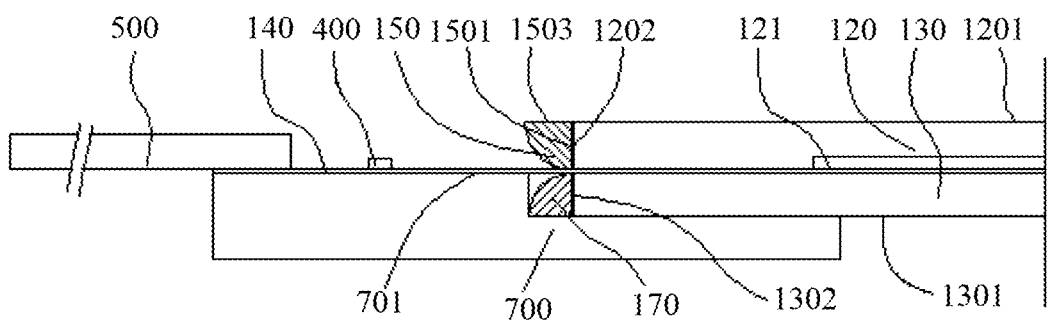
FIG. 8 is a schematic diagram of a process of bonding electrical components on a bonding area of a conductive structure layer of FIG. 6 according to some exemplary embodiments.

In some exemplary embodiments, referring to FIG. 8, before bending the stripped part of the conductive structure layer 140 along the first smooth surface in step S5, the manufacturing method further includes: positioning the stripped part of the conductive structure layer 140 from a side where the first substrate 130 is located, by using a second auxiliary fixture 700, and then bonding electrical components on the bonding area.

In some exemplary embodiments, referring to FIG. 2, step S2 may include: disposing a second substrate 120 on the conductive structure layer 140 and exposing the bonding area outside the second substrate 120, and stripping a part of the conductive structure layer 140 exposed outside the second substrate 120 from the first substrate 130.

In some exemplary embodiments, referring to FIG. 8, step S5 may include: disposing a second protective strip 150 on an end surface of the second substrate 120 corresponding to the cut end surface 1302 of the first substrate 130; bending the stripped part of the conductive structure layer 140 along the first smooth surface; filling a fixing adhesive 160 between the second smooth surface and the conductive structure layer 140 to fix the stripped part of the conductive structure layer 140.

With reference to FIG. 1 to FIG. 19, the manufacturing method of the display panel having the first substrate 130 and the second substrate 120 in this embodiment will be described in detail as an example.

At S01, a motherboard of the display panel is manufactured. In some exemplary embodiments, a schematic diagram of structure of the motherboard of the display panel is shown in FIG. 2, which includes a first substrate 130 and a second substrate 120 which are oppositely disposed. A conductive structure layer 140 is formed on an upper surface of the first substrate 130, and the conductive structure layer 140 is located between the first substrate 130 and the second substrate 120. A first end surface of the first substrate 130 protrudes from a corresponding end surface of the second substrate 120. Accordingly, the bonding area of the conductive structure layer 140 close to a side edge thereof is exposed outside the second substrate 120 and located on a protruding part of the first substrate 130 with respect to the second substrate 120. The protruding part of the first substrate 130 with respect to the second substrate 120 is regarded as a removable frame, and its length can be set according to actual requirements.

In some exemplary embodiments, the conductive structure layer 140 may include a base layer 141, a conductive layer 142, and a protective layer 143 which are sequentially stacked, and the materials of the base layer 141 and the protective layer 143 both include an organic material. The conductive layer 142 is a metal layer, which plays a conductive role and can be bent. The base layer 141 and the protective layer 143 are made of organic materials to ensure that the whole conductive structure layer 140 is flexible and can be bent. Materials of the base layer 141 and the protective layer 143 may be organic materials such as polyimide (PI) or polyethylene terephthalate (PET). The bonding area of the conductive structure layer 140 is configured to be connected with electrical components, such as a driving chip 400 and an external circuit board 500.

At S02, the bonding area of the conductive structure layer 140 is stripped from the first substrate 130. In some exemplary embodiments, as shown in FIG. 3, the bonding area of the conductive structure layer 140 exposed outside the second substrate 120 is stripped in this embodiment. The lower surface of the part 131 of the first substrate 130 corresponding to the area to be stripped of the conductive structure layer 140 (that is, the protruding part of the first substrate 130 with respect to the second substrate 120) can be irradiated by laser b under the first substrate 130, so that the lower surface of the bonding area of the conductive structure layer 140 exposed outside the second substrate 120 is stripped from the upper surface 1303 of the stripped part 131 of the first substrate 130. In this way, the bonding area of the conductive structure layer 140 exposed outside the second substrate 120 is stripped from the first substrate 130.

At S03, the stripped part 131 of the first substrate 130 is cut off. In some exemplary embodiments, as shown in FIG. 4, a first auxiliary fixture 600 is used to adsorb the upper surface of the stripped part of the conductive structure layer 140 on an adsorption surface 601 of the first auxiliary fixture 600, to position the stripped part of the conductive structure layer 140 and maintain its position unchanged. Then the stripped part 131 of the first substrate 130 is cut off from the first substrate 130, so that the end surface of the second substrate 120 is flush with the cut end surface 1302 of the first substrate 130. Herein, a cut surface from which the stripped part 131 of the first substrate 130 is cut off is the cut end surface 1302 of the first substrate 130.

Figure 7:
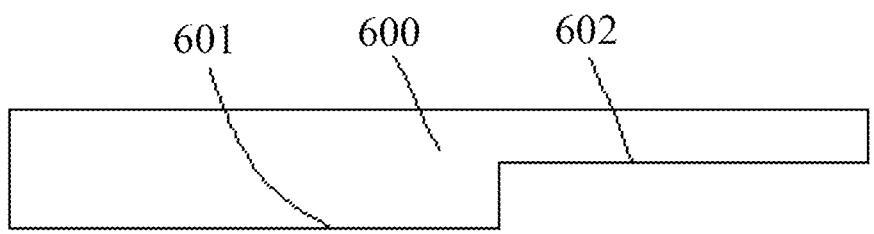
FIG. 7 is a schematic diagram of structure of a first auxiliary fixture used in FIG. 6 according to some exemplary embodiments.

In some exemplary embodiments, referring to FIG. 7, the first auxiliary fixture 600 has an adsorption surface 601 and a limiting surface 602, and has a vacuumizing pipeline inside, and the limiting surface has an L-shape. Referring to FIG. 4, the limiting surface 602 is attached to the upper surface 1201 and the end surface 1202 of the second substrate 120. The inside of the first auxiliary fixture 600 is vacuumized, so that a negative pressure is generated on the adsorption surface 601, and the adsorption surface 601 adsorbs the upper surface of the stripped part of the conductive structure layer 140 under the negative pressure. The limiting surface 602 can be configured to have a vacuum adsorption function, and can be adsorbed on the upper surface 1201 of the second substrate 120 during the vacuumizing, to fix the first auxiliary fixture 600. The adsorption surface 601 and the limiting surface 602 can be regarded as suction disks.

Figure 5:
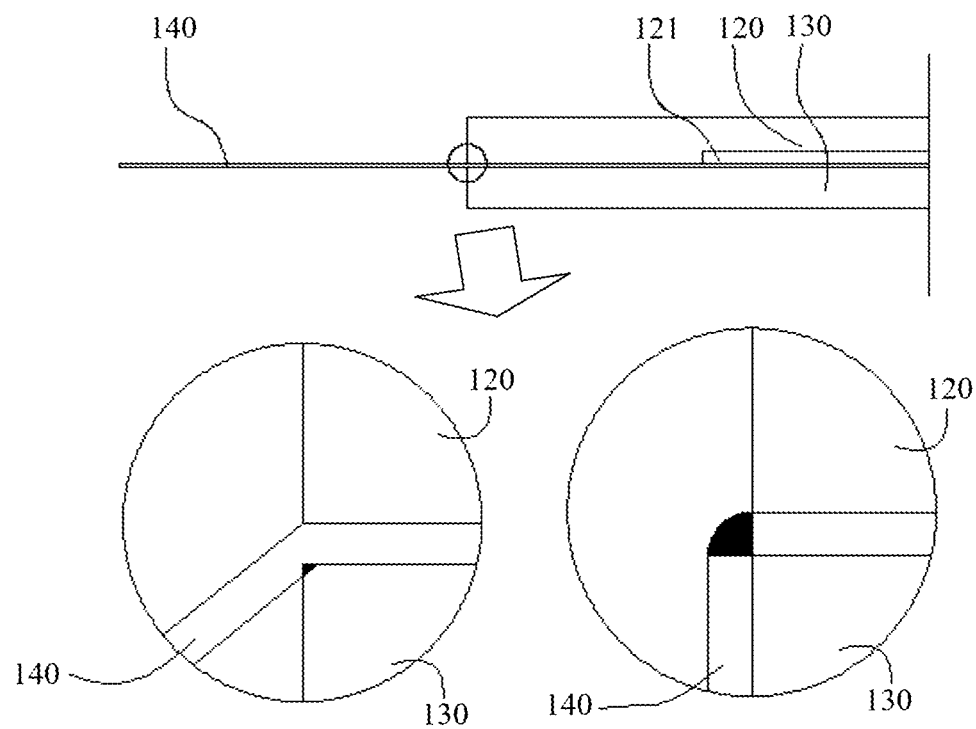
FIG. 5 is a schematic diagram of risks after cutting off a part of a first substrate stripped from a bonding area of a conductive structure layer in FIG. 4 according to some exemplary embodiments.

In some exemplary embodiments, referring to FIG. 5, FIG. 5 is a schematic diagram of risks after cutting off the stripped part 131 of the first substrate 130. A1 is a partial enlarged schematic diagram of the risk of the conductive structure layer 140 being punctured by a sharp corner of the first substrate 130 during the downward bending process in the free state. Similarly, the conductive structure layer 140 has a risk of being punctured by a sharp corner of the second substrate 120 when being bent upward. A2 is a partial enlarged schematic diagram of the risk of the conductive structure layer 140 in an extreme downward bending state. Due to the thickness of the conductive structural layer 140, the outer surface (i.e., the upper surface) of the conductive structural layer 140 is under tensile stress, and the inner surface (i.e., the lower surface) of the conductive structural layer 140 is under compressive stress when the upper and lower surfaces of the conductive structural layer 140 are bent, so that the conductive layer 142 inside the conductive structural layer 140 is at risk of breaking due to shear force on the bending section. In an extreme bending, the bending radius is very small and the shear force is very large. The conductive layer 142 inside the conductive structure layer 140 will break at a point of the bent section. Similarly, the conductive layer 142 inside the conductive structure layer 140 will break at a point of the bent section when the conductive structure layer 140 is extremely bent upward.

Figure 6:
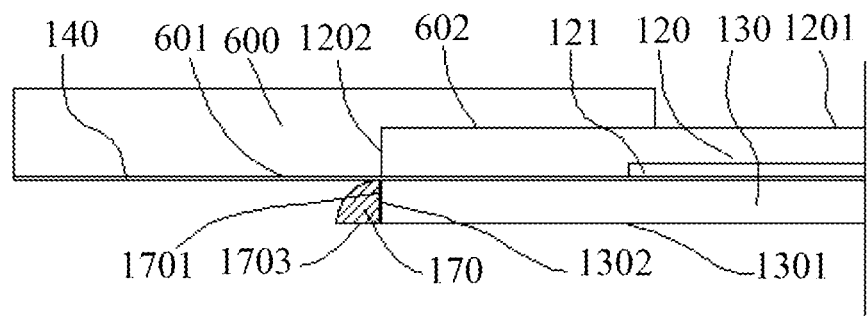
FIG. 6 is a schematic diagram of a process of disposing a first protective strip on a cut end surface of a first substrate of FIG. 4 according to some exemplary embodiments.

At S04, the first protective strip 170 is disposed on the cut end surface 1302 of the first substrate 130. In some exemplary embodiments, as shown in FIG. 6, in order to resolve the risks shown in FIG. 5, a first protective strip is disposed on the cut end surface 1302 of the first substrate 130, when the first auxiliary fixture 600 still adsorbs the stripped part of the conductive structure layer 140 after the stripped area 131 of the first substrate 130 is cut off. The first protective strip can adopt any one of the first protective strips in the previous display panel embodiments.

In this embodiment, the first protective strip 170 shown in FIG. 13B is taken as an example. Referring to FIG. 6, the first side surface (i.e., the attaching surface) 1701 of the first protective strip 170 is attached to the cut end surface 1302 of the first substrate 130, and adhesive can be used between the two surfaces for fixing. The ¼ circular arc surface (i.e., the first smooth surface of the first protective strip 170) 1702 is smoothly connected with a side surface of the first substrate 130 on which the conductive structure layer 140 is formed. The second side surface (i.e., the bottom surface) 1703 is flush with the side surface of the first substrate 130 away from the conductive structure layer 140. After the first protective strip 170 is disposed and fixed, the ¼ circular arc surface 1702 is smoothly connected with the side surface of the first substrate 130 on which the conductive structure layer 140 is formed, so that the ¼ circular arc surface 1702 can let the stripped part of the conductive structure layer 140 bend smoothly under a safe curvature in the subsequent bending step, and will not be punctured by a sharp corner of the first substrate 130.

At S05, a second protective strip 150 is disposed on the end surface 1202 of the second substrate 120, and electrical components are bonded on the stripped part (i.e., the bonding area) of the conductive structure layer 140. In some exemplary embodiments, referring to FIG. 8, a second auxiliary fixture 700 is used to adsorb the lower surface of the stripped part of the conductive structure layer 140 to maintain its relative position unchanged. Then, a second protective strip is disposed at the end surface 1202 of the second substrate 120 (the second protective strip can be any second protective strip in the previous display panel embodiment, and this embodiment is illustrated by taking the second protective strip 150 shown in FIG. 13C as an example), and electrical components such as the driving chip 400 and the external circuit board 500 are bonded on the upper surface of the stripped part of the conductive structure layer 140 by a bonding process. This step cancels the use of COF technology for intermediate transition and reduces the number of times of using auxiliary fixtures.

In some exemplary embodiments, referring to FIG. 13C and FIG. 8, the first side surface (i.e., the attaching surface) 1501 of the second protective strip 150 is attached to the end surface 1202 of the second substrate 120, and adhesive is used between the two surfaces for fixing. The ¼ circular arc surface (i.e., the second smooth surface of the second protective strip 150) 1502 of the second protective strip 150 is smoothly connected with a side surface of the second substrate 120 facing the conductive structure layer 140. The second side surface (i.e., the top surface) 1503 of the second protective strip 150 is flush with the upper surface 1201 of the second substrate 120. The ¼ circular arc surface 1502 of the second protective strip 150 is smoothly connected with a side surface of the second substrate 120 facing the conductive structure layer 140, so that the risk that the conductive structure layer 140 is punctured by a sharp corner of the end surface 1202 of the second substrate 120 when being bent upwards can be avoided, and the conductive structure layer 140 can be smoothly bent under a safe curvature.

Figure 9:
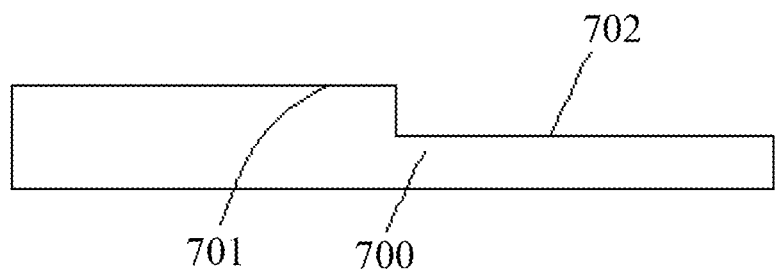
FIG. 9 is a schematic diagram of structure of a second auxiliary fixture used in FIG. 8 according to some exemplary embodiments.

In some exemplary embodiments, referring to FIG. 9, the second auxiliary fixture 700 has an adsorption surface 701 and a limiting surface 702, and has a vacuumizing pipeline inside. Referring to FIG. 8 and FIG. 13B, during adsorption, the limiting surface 702 abuts against the lower surface 1301 of the first substrate 130 and a side part of the first protective strip 170. The limiting surface 702 can be attached to the lower surface 1301 of the first substrate 130 and adapted to the second side surface (i.e., the bottom surface) 1703 of the first protective strip 170 to play a limiting role. In this embodiment, the first protective strip 170 has no flange, and the second side surface 1703 of the first protective strip 170 is flush with the lower surface 1301 of the first substrate 130, so the limiting surface 702 can also be attached to the second side 1703 of the first protective strip 170.

In some exemplary embodiments, after the second auxiliary fixture 700 is disposed in place, the interior of the second auxiliary fixture 700 is vacuumized, so that a negative pressure is generated on the adsorption surface 701, and under the negative pressure, the lower surface of the stripped part of the conductive structure layer 140 is adsorbed on the adsorption surface 701 for positioning. The limiting surface 702 can be configured to have a vacuum adsorption function, and during the vacuumizing, the limiting surface 702 can be adsorbed on the lower surface 1301 of the first substrate 130 to fix the second auxiliary fixture 700. The adsorption surface 701 and the limiting surface 702 can be regarded as suction disks.

Figure 10:
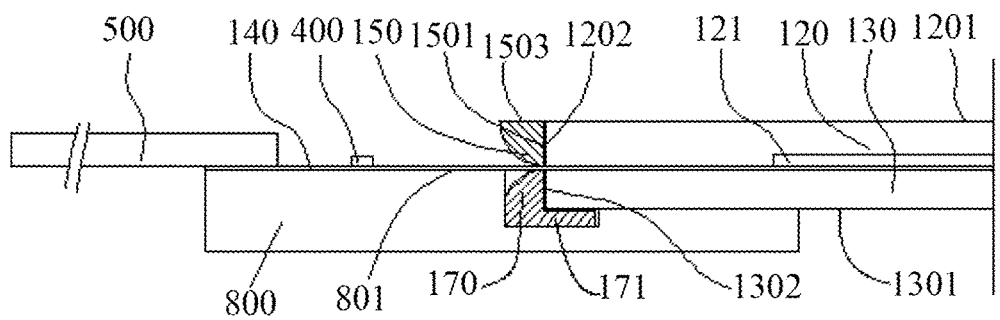
FIG. 10 is a schematic diagram of a process of bonding electrical components on a bonding area of a conductive structure layer according to some exemplary embodiments.
Figure 11:
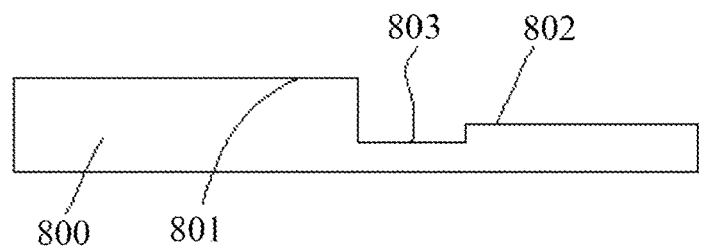
FIG. 11 is a schematic diagram of structure of a second auxiliary fixture used in FIG. 10 according to some exemplary embodiments.

In some exemplary embodiments, referring to FIG. 10 and FIG. 11, when the first protective strip 170 adopted in step S04 of this embodiment (for example, the first protective strip 170 shown in FIG. 14B is adopted) has a flange 171, the structure of the second auxiliary fixture 800 can be as shown in FIG. 11. The adsorption surface 801 of the second auxiliary fixture 800 adsorbs the lower surface of the stripped part of the conductive structure layer 140, and the limiting surface 802 of the second auxiliary fixture 800 is attached to the lower surface 1301 of the first substrate 130 and adapted to the first protective strip 170. Since the first protective strip 170 has the flange 171, the limiting surface 802 is further provided with an avoidance groove 803 for avoiding the flange 171. The limiting surface 802 can be configured to have a vacuum adsorption function, and can be adsorbed on the lower surface 1301 of the first substrate 130 in use to fix the second auxiliary fixture 800. The adsorption surface 801 and the limiting surface 802 can be regarded as suction disks.

Figure 12A:
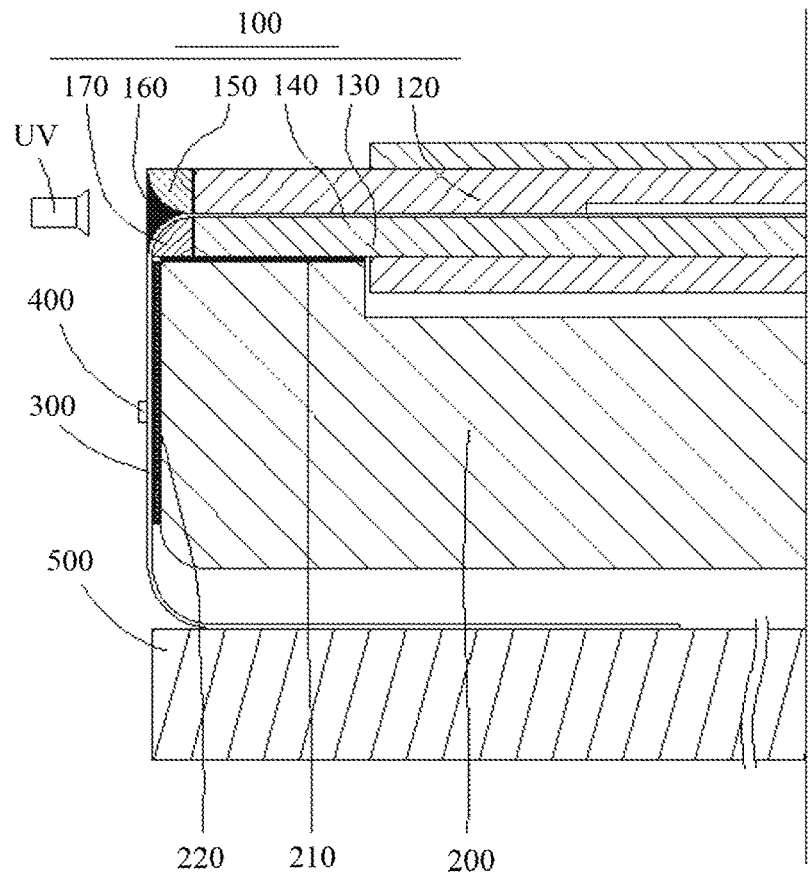
FIG. 12A is a schematic diagram of a process of bending and fixing a stripped part of a conductive structure layer of FIG. 8 along a first smooth surface of a first protective strip according to some exemplary embodiments.
Figure 12B:
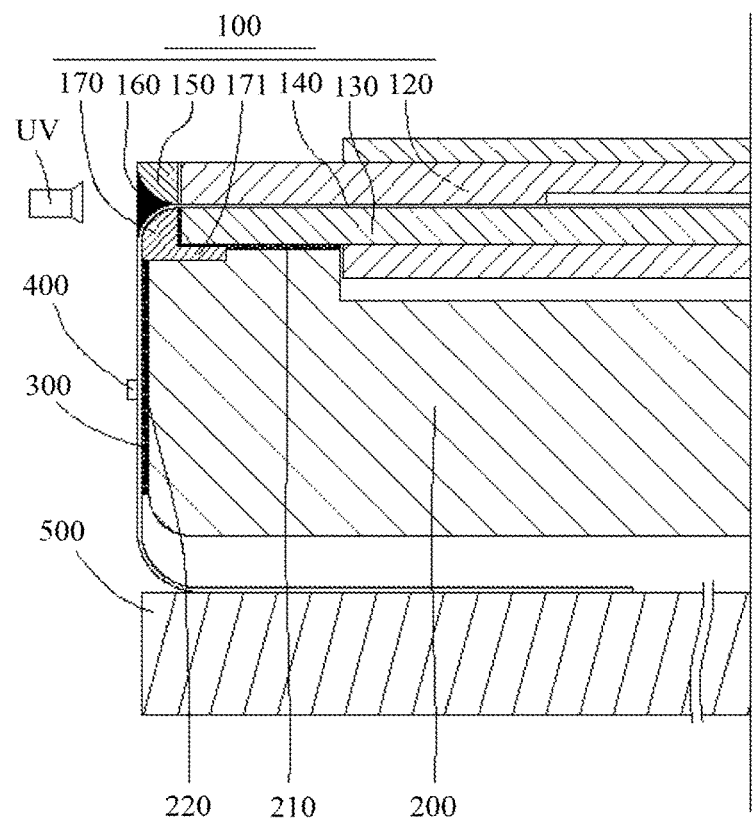
FIG. 12B is a schematic diagram of a process of bending and fixing a stripped part of a conductive structure layer of FIG. 10 along a first smooth surface of a first protective strip according to some exemplary embodiments.

At S06, the stripped part of the conductive structure layer 140 is bent and fixed. In some exemplary embodiments, referring to FIG. 12A and FIG. 12B, FIG. 12A and FIG. 12B are process diagrams of bending and fixing the conductive structure layer 140 in two embodiments using two different first protective strips 170 respectively. After completion of the step S05, the stripped part of the conductive structure layer 140 is smoothly bent to 90 degrees by being attached to the first smooth surface of the first protective strip 170. After the bending, a fixing adhesive 160 is filled between the second smooth surface of the second protective strip 150 and the conductive structure layer 140 to fix the bent part of the conductive structure layer 140 on the first substrate 130 and the second substrate 120. The fixing adhesive 160 can be UV adhesive, and it can be cured by irradiation by a UV light after being filled, to shape and protect the bent part of the conductive structure layer 140.

In some exemplary embodiments, in step S06, the display panel 100 and the backplate assembly 200 may be assembled before the stripped part of the conductive structure layer 140 is bent, so that the stripped part of the conductive structure layer 140 may be fixed on the end surface 220 of the backplate assembly 200 corresponding to the stripped part by an insulating double-sided tape 300 after being bent, and then a fixing adhesive is filled between the second smooth surface of the second protective strip 150 and the conductive structure layer 140, and the bent part of the conductive structure layer 140 is fixed on the first substrate 130 and the second substrate 120.

Referring to FIG. 20, an embodiment of the present application also provides a manufacturing method of a display panel shown in FIG. 20. Since the display panel 100 shown in FIG. 20 does not include the second substrate 120 and the second protective strip 150 mentioned in the above embodiment, accordingly the corresponding steps can be omitted in the manufacturing method of this embodiment, and other steps are the same as those in the above embodiment. In addition, in some exemplary embodiments, the manufacturing method of this embodiment further includes the following steps: before bending the stripped part of the conductive structure layer 140 (i.e., the bonding area) along the first smooth surface of the first protective strip 170, a first fixing adhesive may be coated on the first smooth surface of the first protective strip 170 or/and the lower surface of the bent part of the stripped part of the conductive structure layer 140, so that the bent part of the stripped part of the conductive structure layer 140 can be fixed on the first smooth surface of the first protective strip 170, after the stripped part of the conductive structure layer 140 is bent. Thereafter, a second fixing adhesive 161 may be coated on the upper surface of the bent part of the conductive structure layer 140, so that the second fixing adhesive 161 together with the first protective strip 170 form a right-angle end surface of the first substrate 130, after the second fixing adhesive 161 is cured.

In some exemplary embodiments, according to embodiments of the present application, the base layer 141 and the protective layer 143 made of organic materials such as PI are disposed in the display panel 100 to bear the conductive layer 142 and form the flexible and bendable conductive structure layer 140; the bonding area of the conductive structure layer 140 is stripped from the first substrate 130 by laser, the stripped part of the conductive structure layer 140 is positioned by an auxiliary fixture, and the stripped part of the first substrate 130 is cut off; the stripped part of the conductive structure layer 140 is positioned by an auxiliary fixture, and the end surfaces of the first substrate 130 and the second substrate 120 are respectively provided with protective strips to ensure that the conductive structure layer 140 is smoothly bent and avoid the risk of damage; electrical components such as the driving chip 400 and the external circuit board 500 are directly bonded on the conductive structure layer 140; bending of the flexible conductive structure layer 140 is protected by processes such as UV curing. It is realized that the existing rigid glass-based conductive structure layer is converted into a flexible conductive structure layer 140, and the use of COF technology is reduced, thereby achieving technical effects of simplifying the process, reducing the cost, greatly reducing the frame on the external circuit side of the display panel 100 to realize narrow frames in all sides, and solving the problems of the damage risk of the base layer 141 and the protective layer 143 and the breaking risk of the conductive layer 142.

In the description herein, the terms "connection", "fixed connection", "installation" and "assembly" are to be understood broadly, for example, they may be fixed connection, or they may be detachable connection, or they may be integrally connected, unless explicitly specified and limited otherwise. The terms "installation", "connection" and "fixed connection" may be directly connected, or may be indirectly connected through an intermediate medium, or may be an internal connection between two elements. Those of ordinary skill in the art can understand the specific meanings of the above mentioned terms herein.

What we claim is:

1. A display panel, comprising a first substrate, on which a conductive structure layer is formed, wherein:
the conductive structure layer has a bonding area close to a side edge thereof, at least a part of the bonding area of the conductive structure layer protrudes from a first side edge of the first substrate, and is bent toward a side of the first substrate away from the conductive structure layer and fixed;
an end surface of the first side edge of the first substrate is provided with a first protective strip, the first protective strip has a first smooth surface facing the conductive structure layer and smoothly connected with a side surface of the first substrate on which the conductive structure layer is formed, and a bent part of the conductive structure layer is attached to the first smooth surface and
the display panel further comprises a second substrate covering on the conductive structure layer, wherein an end surface of the second substrate corresponding to the end surface of the first side edge of the first substrate is provided with a second protective strip, and a fixing adhesive is filled between the second protective strip and the bent part of the conductive structure layer.

2. The display panel according to claim 1, wherein the first protective strip comprises a strip-shaped body having a bottom surface, an attaching surface attached to the end surface of the first side edge of the first substrate, and the first smooth surface, two ends of the first smooth surface are respectively connected with the attaching surface and the bottom surface, and the first smooth surface comprises an arc-shaped surface with an arc-shaped section, and the arc-shaped surface is smoothly connected with the side surface of the first substrate on which the conductive structure layer is formed.

3. The display panel according to claim 2, wherein the first protective strip further comprises a flange integrally connected with the strip-shaped body, the flange is connected with the attaching surface of the strip-shaped body, and a top surface of the flange is attached to the side surface of the first substrate away from the conductive structure layer.

4. The display panel according to claim 3, wherein the flange is provided with a plurality of notches disposed at intervals along a length direction of the flange, and the plurality of notches penetrate through the top surface and a bottom surface of the flange.

5. The display panel according to claim 1, wherein the second protective strip has a second smooth surface facing the conductive structure layer, and the fixing adhesive is filled between the second smooth surface and the bent part of the conductive structure layer.

6. The display panel according to claim 5, wherein the second protective strip comprises a strip-shaped body having a top surface, an attaching surface attached to the end surface of the second substrate, and a second smooth surface, two ends of the second smooth surface are respectively connected with the attaching surface and the top surface, and the second smooth surface comprises an arc-shaped surface with an arc-shaped section, and the arc-shaped surface is smoothly connected with a side surface of the second substrate facing the conductive structure layer.

7. The display panel according to claim 1, wherein the conductive structure layer comprises a base layer, a conductive layer and a protective layer which are sequentially stacked, and materials of the base layer and the protective layer both comprise an organic material.

8. A display device comprising the display panel according to claim 1 and a backplate assembly disposed on a side surface of the first substrate away from the conductive structure layer, wherein the conductive structure layer is bent along the first smooth surface and then attached to an end surface of the backplate assembly.

9. A manufacturing method of a display substrate, comprising:
forming a conductive structure layer on a first substrate, the conductive structure layer having a bonding area close to a side edge thereof;
stripping at least a part of the bonding area from the first substrate;
cutting off a part of the first substrate stripped from the bonding area to make a stripped part of the conductive structure layer protrude from a cut end surface of the first substrate;
disposing a first protective strip on the cut end surface of the first substrate, the first protective strip having a first smooth surface facing the conductive structure layer and smoothly connected with a side surface of the first substrate on which the conductive structure layer is formed; and
bending and fixing the stripped part of the conductive structure layer along the first smooth surface,
wherein the stripping at least a part of the bonding area from the first substrate comprises:
disposing a second substrate on the conductive structure layer, and exposing the bonding area outside the second substrate; and
stripping a part of the conductive structure layer exposed outside the second substrate from the first substrate,
wherein the bending and fixing the stripped part of the conductive structure layer along the first smooth surface comprises:
disposing a second protective strip on an end surface of the second substrate corresponding to the cut end surface of the first substrate;
bending the stripped part of the conductive structure layer along the first smooth surface; and
filling a fixing adhesive between the second protective strip and the conductive structure layer to fix the stripped part of the conductive structure layer.

10. The manufacturing method of the display panel according to claim 9, wherein the stripping at least a part of the bonding area from the first substrate comprises:
irradiating the bonding area of the conductive structure layer by laser from a side of the first substrate away from the conductive structure layer, to strip a corresponding part of the bonding area from the first substrate.

11. The manufacturing method of the display panel according to claim 9, wherein the cutting off a part of the first substrate stripped from the bonding area comprises:
positioning the stripped part of the conductive structure layer by using a first auxiliary fixture; and
cutting off the part of the first substrate stripped from the bonding area.

12. The manufacturing method of the display panel according to claim 9, wherein the first protective strip further has a bottom surface and an attaching surface attached to the cut end surface of the first substrate, two ends of the first smooth surface are respectively connected with the attaching surface and the bottom surface, the first smooth surface comprises an arc-shaped surface with an arc-shaped section, and the disposing the first protective strip on the cut end surface of the first substrate comprises:

attaching the attaching surface of the first protective strip to the cut end surface of the first substrate, to make the arc-shaped surface be smoothly connected with the side surface of the first substrate on which the conductive structure layer is formed.

13. The manufacturing method of the display panel according to claim 9, wherein before bending the stripped part of the conductive structure layer along the first smooth surface, the manufacturing method further comprises:
   positioning the stripped part of the conductive structure layer from a side where the first substrate is located, by using a second auxiliary fixture; and
   bonding an electrical component on the bonding area.

14. The manufacturing method of the display panel according to claim 13, wherein the second auxiliary fixture has an adsorption surface and a limiting surface, and the positioning the stripped part of the conductive structure layer from a side where the first substrate is located, by using the second auxiliary fixture, comprises:
   abutting the limiting surface of the second auxiliary fixture against a side surface of the first substrate away from the conductive structure layer and a side part of the first protective strip; and
   vacuumizing an inside of the second auxiliary fixture to generate a negative pressure on the adsorption surface, wherein the stripped part of the conductive structure layer is adsorbed and positioned on the adsorption surface under the negative pressure.

15. The manufacturing method of the display panel according to claim 9, wherein the second protective strip has a top surface, an attaching surface attached to the end surface of the second substrate, and a second smooth surface connected between the top surface and the attaching surface, and the disposing the second protective strip on the end surface of the second substrate corresponding to the cut end surface of the first substrate comprises:
   attaching the attaching surface of the second protective strip to the end surface of the second substrate, to make the second smooth surface is smoothly connected with a side surface of the second substrate facing the conductive structure layer.

* * * * *